US010692571B1

(12) United States Patent
Wu et al.

(10) Patent No.: US 10,692,571 B1
(45) Date of Patent: Jun. 23, 2020

(54) MEMORY DEVICE

(71) Applicants: Jiangsu Advanced Memory Technology Co., Ltd., Jiangsu (CN); ALTO MEMORY TECHNOLOGY CORPORATION, Hsinchu County (TW)

(72) Inventors: Jui-Jen Wu, Hsinchu County (TW); Fan-Yi Jien, Hsinchu County (TW); Sheng-Tsai Huang, Hsinchu County (TW); Junhua Zheng, Beijing (CN)

(73) Assignees: Jiangsu Advanced Memory Technology Co., Ltd., Jiangsu (CN); ALTO MEMORY TECHNOLOGY CORPORATION, Hsinchu County, Taiwan (CN)

(*) Notice: Subject to any disclaimer, the term of this patent is extended or adjusted under 35 U.S.C. 154(b) by 0 days.

(21) Appl. No.: 16/362,719

(22) Filed: Mar. 25, 2019

(30) Foreign Application Priority Data

Dec. 24, 2018 (CN) .......................... 2018 1 1582708

(51) Int. Cl.
*G11C 13/00* (2006.01)
(52) U.S. Cl.
CPC ........ *G11C 13/0004* (2013.01); *G11C 13/004* (2013.01); *G11C 13/0026* (2013.01); *G11C 13/0028* (2013.01); *G11C 13/0069* (2013.01)

(58) Field of Classification Search
CPC ............ G11C 13/0004; G11C 13/0026; G11C 13/004; G11C 13/0028
USPC .................................................. 365/163, 148
See application file for complete search history.

(56) References Cited

U.S. PATENT DOCUMENTS

| 2011/0063902 | A1* | 3/2011 | Lung ...................... G11C 7/067 365/163 |
| 2014/0063927 | A1* | 3/2014 | Willey ............... G11C 13/0069 365/163 |
| 2014/0269030 | A1* | 9/2014 | Chih .................... G11C 29/021 365/158 |
| 2017/0140819 | A1* | 5/2017 | Lee ..................... G11C 13/0038 |

* cited by examiner

*Primary Examiner* — Han Yang
(74) *Attorney, Agent, or Firm* — CKC & Partners Co., LLC

(57) ABSTRACT

A memory device includes a memory array, a bit line driving circuit, a word line driving circuit, a read/write circuit, a controller, and a reference driving circuit. The memory array includes several memory units. The bit line driving circuit is configured to interpret a memory bit address and to drive a bit line. The word line driving circuit is configured to interpret a memory word address and to drive a word line. The read/write circuit is configured to read, set, or reset the memory units. The controller is configured to switch the memory array to work in a single memory unit mode or a dual memory unit mode. The reference driving circuit is configured to drive a reference line, wherein the reference line comprises several reference units, and the reference line and the reference units are located in the memory array.

15 Claims, 3 Drawing Sheets

MEMORY DEVICE

CROSS-REFERENCE TO RELATED APPLICATION

This application claims the priority benefit of Chinese Application serial no. 201811582708.7, filed Dec. 24, 2018, the full disclosure of which is incorporated herein by reference.

TECHNICAL FIELD

The present disclosure relates to a memory device. More particularly, the present disclosure relates to a phase change memory device.

DESCRIPTION OF RELATED ART

In memory technology, a resistive random-access memory includes a phase change memory (PCM), which can change a resistance value of a component by a crystal phase change of the material thereof, so as to store information by a change in resistance value. When the material in the memory element is crystalline, it exhibits a low resistance value, and conversely, when the material in the memory element is in an amorphous state, it exhibits a high resistance value, thereby storing data such as "1" or "0".

In the prior art, when reading the data of the memory unit in the memory device, the single memory unit is turned on, and the current corresponding to the single memory unit is compared with the reference current to determine whether a single data stored in the memory unit is "1" or "0". However, comparisons with current values may cause errors due to different bias voltages. Furthermore, the judgment of data reading with a single memory unit is liable to cause errors.

For details, reference is made to FIG. 1. In the prior art, a row decoding circuit (row decoder) and a column decoding circuit (column decoder) are located at a periphery of a cell array, and a read/write circuit (R/W circuit), which includes the sense amplifier circuit (sense amplifier) for reading the bit data, is located at a periphery of a column decoding circuit. When reading the resistive random-access memory component, the currents of the memory element and the reference current are compared by the sense amplifier circuit to determine whether the information of the memory element is "1" or "0". Existing memory architectures include at least two major problems: (1) the reference circuit is located in the read/write circuit, in which typically a transistor is configured to generate a reference current. The position difference between the location of the transistor and the location of the memory cell is too large, and the magnitude of the currents generated at different positions of different memory cells are slightly different, which causes different noise margins for determining logic "1" or "0" of each cell and makes the optimization of memory performance be unreachable. Furthermore, the reference current is generated by the transistor, but the current of the resistive random-access memory cell is determined by the effective resistance of the memory cell. The process variation mechanism of the memory cell is different from that of the transistor, so the reference current cannot accurately adapt to the variation of the memory cell. (2) In the prior art, since the read/write circuit is located at the periphery of the column decoding circuit, when reading the memory unit, due to the loading effect of the bit line, the reading speed of the memory unit farthest from the reading circuit is the slowest. Therefore, the speed of the entire memory is decided by the slowest memory unit.

SUMMARY

An aspect of the present disclosure is to provide a memory device. The memory device includes a memory array, a bit line driving circuit, a word line driving circuit, a read/write circuit, a controller, and a reference driving circuit. The memory array includes several memory units. The bit line driving circuit is configured to interpret a memory bit address and to drive a bit line. The word line driving circuit is configured to interpret a memory word address and to drive a word line. The read/write circuit is configured to read, write, or reset the memory units. The controller is configured to switch the memory array to work in a single memory unit mode or a dual memory unit mode. The reference driving circuit is configured to drive a reference line, wherein the reference line comprises several reference units, and the reference line and the reference units are located in the memory array.

Another aspect of the present disclosure is to provide a memory device. A memory device includes a memory array, a bit line driving circuit, and a word line driving circuit. The memory array includes a plurality of first bit lines, a plurality of second bit lines, a plurality of word lines, and a plurality of memory unit groups. The first bit lines and the second bit lines are aligned sequentially. Each of the plurality of memory unit groups couples to one of the word lines, wherein each of the memory unit groups includes a first memory unit and a second memory unit. The first memory unit is coupled to one of the first bit lines. The second memory unit is coupled to one of the second bit lines. The bit line driving circuit includes a first decoding circuit, a second decoding circuit, and a read/write circuit. The first decoding circuit is coupled to the first bit lines. The second decoding circuit is coupled to the second bit lines. The read/write circuit is coupled to the first decoding circuit and the second decoding circuit, and the read/write circuit is configured to read or write the memory units. The word line driving circuit is coupled to the word lines.

In sum, embodiments of this disclosure are to provide a memory device, and in particular, a phase change memory device. After the chip is completed, the user is still able to adopt single memory unit mode or dual memory unit mode according to his own needs. When the memory is operated in the single memory unit mode, the memory may obtain the maximum design capacity; in addition, since the reference current is generated by using the reference resistor, and the reference resistor is formed by the same material and process of the resistive random-access element, therefore, the process variation mechanism of the reference resistor is the same as that of the resistive random-access element of the memory unit. Therefore, the resistance variation of the resistive random-access element may be almost the same as the variation of the process, which results in more reading accuracy than the prior art. When operating in the dual memory unit mode, the data stored in the dual memory unit is read to determine whether the data stored in the memory unit is "1" or "0" so as to increase the accuracy of the data of the memory unit. The dual memory operation mode eliminates the loading effect of the memory unit, thus improving the reading speed of the memory.

BRIEF DESCRIPTION OF THE DRAWINGS

The present disclosure can be more fully understood by reading the following detailed description of the embodiment, with reference made to the accompanying drawings as follows.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
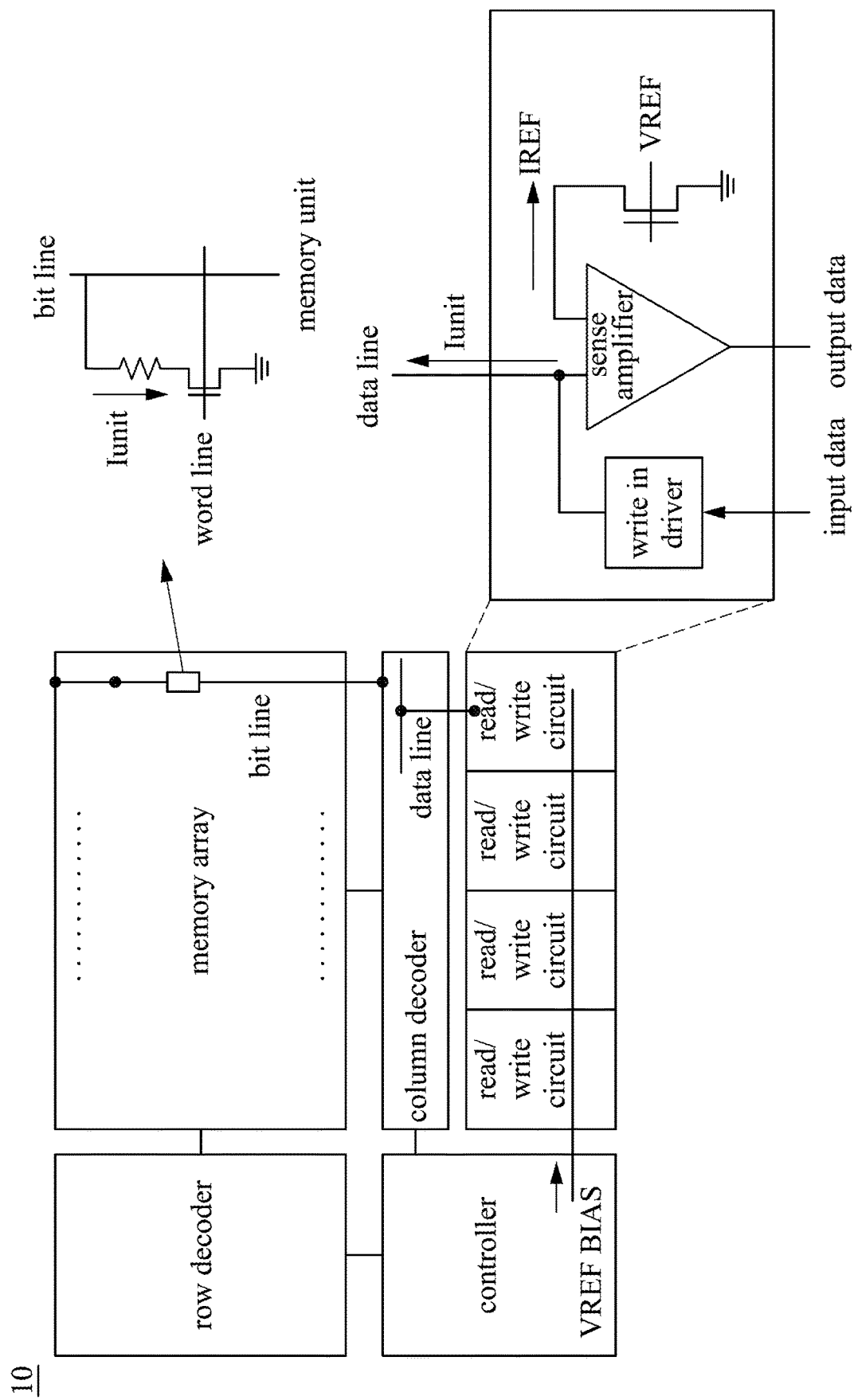
FIG. 1 is a current technology.
Figure 2:
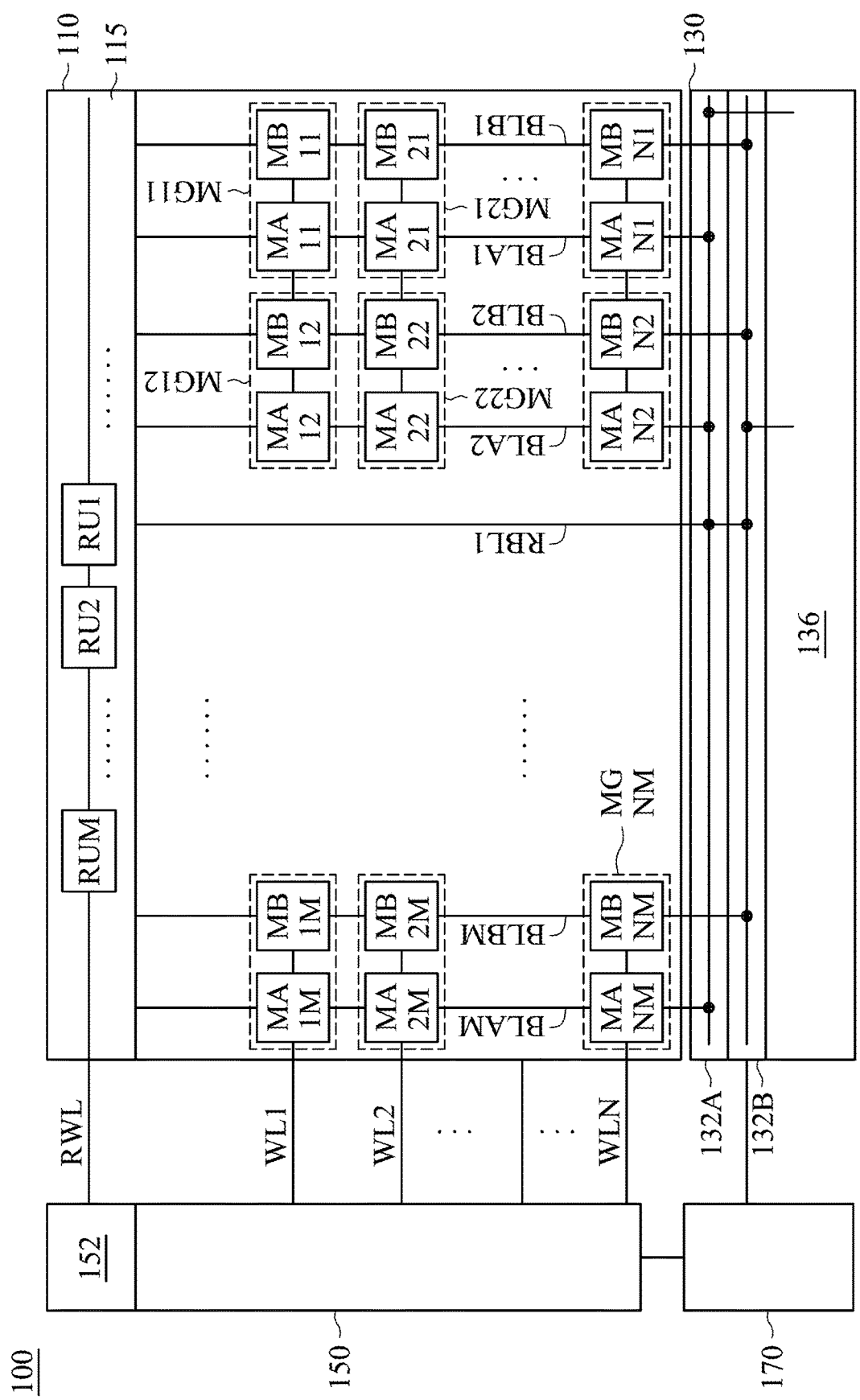
FIG. 2 is a schematic diagram of a memory device according to some embodiments of the present disclosure.

Reference is made to FIG. 2. FIG. 2 is a schematic diagram of a memory device 100 according to some embodiments of the present disclosure. Take phase change memory (PCM) as an example, as illustrated in FIG. 2, the memory device 100 includes a memory array 110, the bit line driving circuit 130, the word line driving circuit 150, the read/write circuit 136, and the controller 170. The memory array 110 includes several word lines WL1 to WLN and several bit lines BLA1, BLA2, BLB1, BLB2 to BLAM, BLBM. The bit line driving circuit 130 is configured to decode the read and/or write address inputted to the memory and to drive one of the bit lines. The word line driving circuit 150 is configured to decode the read and/or write address inputted to the memory and drive one of the word lines. The controller 170 control the read/write circuit 136 and is configured to distinguish the bit address from the word address of a set of read/write address which is inputted to the controller, and the read/write circuit The memory array 110 includes several memory units MA11 to MANM, MB11 to MBNM. The bit line driving circuit 130 includes the first decoding circuit 132A and the second decoding circuit 132B.

In the connection configuration, the controller 170 is coupled to the bit line driving circuit 130 and the word line driving circuit 150. The word line driving circuit 150 is coupled to several word lines WL1 to WLN. The bit line driving circuit 130 is coupled to several bit lines BLA1 to BLAM, BLB1 to BLBM. Furthermore, the read/write circuit 136 is coupled to the first decoding circuit 132A and the second decoding circuit 132B.

In details, the memory units MA1 to MANM are first memory units, and the memory units MB11 to MBNM are the second memory units. The bit lines BLA1 to BLAM are the first bit lines, and the bit lines BLB1 to BLBM are the second bit lines. The first bit lines BLA1 to BLAM and the second bit lines BLB1 to BLBM are arranged in order. For example, as illustrated in FIG. 2, the arranged order of the bit lines is the first bit line BLA1, the second bit line BLB1, the bit line BLA2, the second bit line BLB2, and so on.

Each of the first memory units MA11 to MANM couples to one of the first bit lines BLA1 to BLAM. To be more detailed, the memory units MA11 to MAN1 couple to the bit line BLA1, the memory units MA12 to MAN2 couple to the bit line BLA2, the memory units MA13 to MAN3 couple to the bit line BLA3, and so on, and the first bit lines BLA1 to BLAM couple to the first decoding circuit 132A. On the other hand, each of the second memory units MB11 to MBNM couples to one of the second bit lines BLB1 to BLBM. To be more detailed, memory units MB11 to MBN1 couple to the bit line BLB1, memory units MB12 to MBN2 couple to the bit line BLB2, memory units MB13 to MBN3 couple to the bit line BLB3, and so on, and the second bit lines BLB1 to BLBM couple to the second decoding circuit 132B. Each of the first memory units MA11 to MANM and the second memory units MB11 to MBNM couples to one of the word lines WL1 to WLN. To be more detailed, memory units from MA11 and MB11 to MA1M and MB1M are coupled to the word line WL1, memory units from MA21 and MB21 to MA2M and MB2M are coupled to the word line WL2, memory units from MAN1 and MBN1 to MANM and MBNM are coupled to word line WLN.

For example, the first memory unit MA11 is coupled to the word line WL1 and the first bit line BLA1, the first bit line BLA1 is further coupled to the first decoding circuit 132A, and so on. The second memory unit MB11 is coupled to the word line WL1 and the second bit line BLB1, the second bit line BLB1 is further coupled to the second decoding circuit 132B, and so on.

The several memory units MA11 to MANM, MB11 to MBNM include several memory unit groups MG11 to MGNM. Each of the memory unit groups MG11 to MGNM includes one of the first memory units MA11 to MANM and one of the second memory units MB11 to MBNM. For example, the memory unit group MG11 includes the first memory unit MA11 and the second memory unit MB11, and the memory unit group MG21 includes the first memory unit MA21 and the second memory unit MB21, and so on. The first memory unit and the second memory unit in the same memory unit group are adjacent to each other. For example, the first memory unit MA11 and the second memory unit MB11 of the memory unit group MG11 are adjacent to each other, and the first memory unit MA12 and the second memory unit MB12 of the memory unit group MG12 are adjacent to each other, and so on.

In the operation configuration, the read/write circuit 136 is configured to read or write information to the memory units MA11 to MANM, MB11 to MBNM. Every one of the memory units MA11 to MANM, MB11 to MBNM includes a memory layer (not shown). The memory layer is made of specific material, in which the specific material may change its internal status based on external operating conditions (for example: crystalline, amorphous, magnetic field, etc.) and includes different electrical properties. Thus, according to different electrical properties (for example: resistance, magnetoresistance, etc.) presented by the memory layer, memory units MA11 to MANM, MB11 to MBNM store different data equivalently. For example, in some embodiments, the memory units MA11 to MANM, MB11 to MBNM may be phase change random access memory units, and the memory layer may be implemented by a material such as a chalcogenide, but the embodiments of the present disclosure are not limited thereto. At different operating temperatures, the memory layer has different crystalline states to store different data equivalently.

The above-mentioned memory units MA11 to MANM, MB11 to MBNM, and the implementation materials thereof are merely examples. Other forms of memory that can be used to implement memory units MA11 to MANM, MB11 to MBNM, for example, variable resistance random access memory (ReRAM), magneto resistive random access memory (MRAM), etc., are within the scope of the embodiments of the present disclosure.

The number of bit lines BLA1 to BLAM, BLB1 to BLBM, word lines WL1 to WLN, and memory units MA11 to MANM, MB11 to MBNM in FIG. 2 mentioned above are for illustrative purposes only, and the embodiments of the present disclosure are not limited thereto.

For ease of explanation, the following paragraphs are explained by implementing the memory units MA11 to MANM and MB11 to MBNM by phase change memory units, but as described above, the memory units MA11 to MANM and MB11 to MBNM of the present disclosure are for illustrative purposes only, and the embodiments of the present disclosure are not limited thereto.

In some embodiments, in the case of phase change memory, when reading memory units MA11 to MANM, MB11 to MBNM, a read pulse can be applied to the memory units MA11 to MANM, MB11 to MBNM, and the current value of the memory units MA11 to MANM, MB11 to MBNM are distinguished so as to identify whether the stored data is data "1" or data "0".

Furthermore, if a reset pulse is applied to the memory units MA11 to MANM, MB11 to MBNM, the operating voltage of the memory units MA11 to MANM, MB11 to MBNM may increase rapidly, and the temperature of the phase change materials of the memory units MA11 to MANM, MB11 to MBNM rises to the molten state accordingly. And then the operating voltage is rapidly dropped, so that the phase change materials of the memory units MA11 to MANM, MB11 to MBNM become amorphous states. Under the condition, the memory units MA11 to MANM, MB11 to MBNM are of high resistance values.

On the other hand, if a set pulse is applied to the memory units MA11 to MANM and MB11 to MBNM, and because of the voltage soaring of the set pulse, the operating temperature of the memory layer of the memory units MA11 to MANM and MB11 to MBNM exceeds a specific temperature within a certain period of time. Under those conditions, the component state of the memory layer transforms into crystalline state. Therefore, the memory units MA11 to MANM and MB11 to MBNM are of low resistance values.

In some embodiments, the data corresponding to the high resistance value is logic "1", and the data corresponding to the low resistance value is logic "0". In some other embodiments, the data corresponding to the high resistance value is logic "0", and the data corresponding to the low resistance value is logic "1".

Reference is made to FIG. 2 again. In some embodiments, each of the memory unit groups MG11 to MGNM represents a memory data. When the read/write circuit 136 reads the data stored in each of the memory unit groups MG11 to MGNM, the read/write circuit 136 determines the data stored in the memory unit groups MG11 to MGNM according to the first memory unit and the second memory unit of each memory unit groups MG11 to MGNM.

For example, the read/write circuit 136 determines the data stored in the memory unit group MG11 according to the first memory unit MA11 and the second memory unit MB11 of the memory unit group MG11. The read/write circuit 136 determines the data stored in the memory unit group MG12 according to the first memory unit MA12 and the second memory unit MB12 of the memory unit group MG12, and so on.

In some embodiments, the data stored in the first memory unit and the data stored in the second memory unit of each of the memory unit groups MG11 to MGNM are complementary to each other, which is configured to represent a memory data. When the resistance value of the first memory unit corresponds to the data of 1, and the resistance value of the second memory unit corresponds to the data of 0, the read write/circuit 136 determines that the memory data of the one of the memory unit groups MG11 to MGNM is 1. When the resistance value of the first memory unit corresponds to the data of 0, the resistance value of the second memory unit corresponds to the data of 1; the read write/circuit 136 determines that the memory data of the one of the memory unit groups MG11 to MGNM is 0.

For example, when the resistance value of the first memory unit MA11 corresponds to the data of 1, and the resistance value of the second memory unit MB11 corresponds to the data of 0, the read/write circuit 136 determines that the memory data of the memory unit group MG11 is 1. On the contrary, when the resistance value of the first memory unit MA11 corresponds to the data of 0, and the resistance value of the second memory unit MB11 corresponds to the data of 1, the read/write circuit 136 determines that the memory data of the memory unit group MG11 is 0.

In some embodiments, when reading the data of the memory unit groups MG11 to MGNM, the first decoding circuit 132A reads the data of the first memory unit, and the second decoding circuit 132B reads the data of the second memory unit, and then the read write/circuit 136 determines the memory data of one of the memory unit groups MG11 to MGNM according to the data read by the first decoding circuit 132A and the second decoding circuit 132B. Next, the first decoding circuit 132A and the second decoding circuit 132B respectively transmit the read data to the read write/circuit 136, so as to let the read/write circuit 136 determine the data stored in one of the memory unit groups MG11 to MGNM.

In the embodiments of the present disclosure, as described above, the memory device 100 may be operated in a single memory unit mode or in a dual memory unit mode. The dual memory unit mode refers to the mode of operation in which a data unit is stored in two memory units, as described in the previous paragraph. On the other hand, the single memory unit mode refers to an operation mode in which a data is stored in a single memory unit, which will be described in the following paragraphs.

Reference is made to FIG. 2. In some embodiments, the memory array 110 further includes a reference line 115. The reference line 115 includes several reference units RU1, RU2 to RUM. In the connection relationship, each of the reference units RU1, RU2 to RUM couples to the first decoding circuit 132A and the second decoding circuit 132B. As illustrated in the figure, the reference line is located at the top of the memory array, which is for illustrative purposes only, in some other embodiments, the reference line may be located at any place of the memory array, for example, located at the bottom or the middle of the memory array.

In some embodiments, when the memory device 100 is operated in the single memory unit mode, each of the memory units MA11 to MANM, MB11 to MBNM represents a data. When the read/write circuit 136 reads the data of one of the second memory units MB11 to MBNM, the first decoding circuit 132A reads the reference data of one of the reference units RU1 to RUM, and the second decoding circuit 132B reads the data of one of the second memory units MB11 to MBNM. Next, the first decoding circuit 132A and the second decoding circuit 132B respectively transmit the read data to the read/write circuit 136. And then, according to the reference data of one of the reference units RU1 to RUM and the data of the one of the second memory units MB11 to MBNM, the read/write circuit 136 determines the data of the one of the second memory units MB11 to MBNM.

Similarly, when the read/write circuit 136 reads a data of one of the first memory units MA11 to MANM, the first decoding circuit 132A reads a data of one of the first memory units MA11 to MANM, and the second decoding circuit 132B reads the reference data of one of the reference units RU1 to RUM. Next, the first decoding circuit 132A and the second decoding circuit 132B respectively transmit the read data to the read/write circuit 136. And then, according to the reference data of one of the reference units RU1 to RUM and the data of the one of the second memory units MA11 to MANM, the read/write circuit 136 determines the data of the one of the second memory units MA11 to MANM.

For example, when the read/write circuit 136 reads the data of the first memory unit MA11, the first decoding circuit 132A reads the data of the first memory unit MA11, and the second decoding circuit 132B reads the reference data of the reference unit RU1. The read/write circuit 136 determines the data of the first memory unit MA11 depending on the reference data of the reference unit RU1 and the data of the first memory unit MA11.

On the other hand, when the read/write circuit 136 reads the data of the second memory unit MB11, the second decoding circuit 132B reads the data of the second memory unit MB11, and the first decoding circuit 132A reads the reference data of the reference unit RU1. The read/write circuit 136 determines the data of the second memory unit MB11 according to the reference data of the reference unit RU1 and the data of the second memory unit MB11.

In some embodiments, the first decoding circuit 132A and the second decoding circuit 132B respectively include several switches (not shown). When the memory device 100 is operated in single memory unit mode, the switches control the first decoding circuit 132A to read the data of one of the bit lines BLA1 to BLAM and control the second decoding circuit 132B to read the reference data of one of the reference units RU1 to RUM. Or, the switches control the first decoding circuit 132A to read the reference data of one of the reference units RU1 to RUM and control the second decoding circuit 132B to read the data of one of the bit lines BLB1 to BLBM. On the other hand, when the memory device 100 is operated in the dual memory unit mode, the switches control the first decoding circuit 132A to read the data of one of the bit lines BLA1 to BLAM and control the second decoding circuit 132B to read the data of one of the bit lines BLB1 to BLBM.

Reference is made to FIG. 2 again. In some embodiments, the memory device 100 further includes the reference driving circuit 152, which is coupled to the reference line 115 and is configured to drive the reference line 115. In some embodiments, the memory device 100 further includes the controller 170, which is coupled to the bit line driving circuit 150 and the word line driving circuit 130, and the memory device 100 is configured to control the bit line driving circuit 150 and the word line driving circuit 130.

Figure 3:
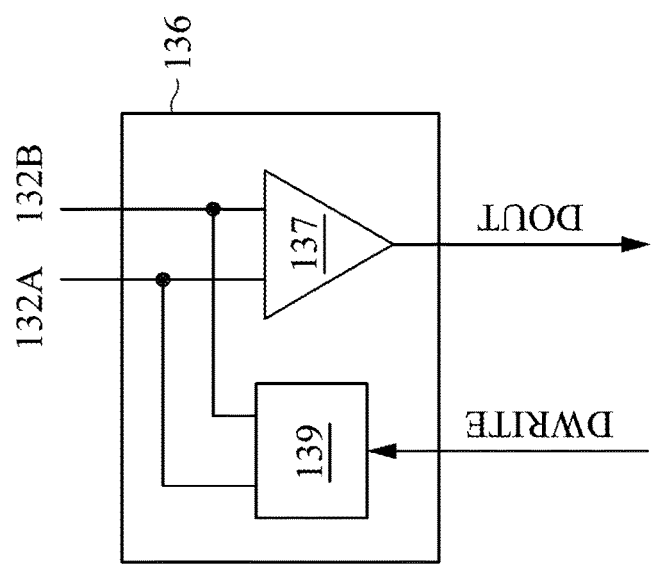
FIG. 3 is a schematic diagram of a read/write circuit in accordance with some embodiments of the present disclosure.

Reference is made to FIG. 3. FIG. 3 is a schematic diagram of a read/write circuit 136 in accordance with some embodiments of the present disclosure. As illustrated in FIG. 3, the read/write circuit 136 includes a sense amplifier circuit 137 and a write-in driver 139.

The sense amplifier circuit 137 is coupled to the first decoding circuit 132A and the second decoding circuit 132B as illustrated in FIG. 2. The sense amplifier circuit 137 is configured to determine the memory data according to the data transmitted from the first decoding circuit 132A and the second decoding circuit 132B. To be more detailed, the first input terminal of the sense amplifier circuit 137 is configured to receive the data transmitted from the first decoding circuit 132A, the second input terminal of the sense amplifier circuit 137 is configured to receive the data transmitted from the second decoding circuit 132B, and the output terminal of the sense amplifier circuit 137 is configured to output the output data DOUT after determination.

The write-in driver 139 is coupled to the first decoding circuit 132A and the second decoding circuit 132B. In the operational, the write-in driver 139 receives the write-in data DWRITE, and, through the first decoding circuit 132A and/or the second decoding circuit 132B, write the write-in data DWRITE to the memory units MA11 to MANM, MBAA to MBNM.

To be more detailed, when the memory device 100 is operated in the dual memory unit mode, the write-in driver 139 writes data into the first memory units MA11 to MANM through the first decoding circuit 132A and writes data to the second memory unit MBAA to MBNM through the second decoding circuit 132B. The data written into the first memory units and the second memory units of the same memory units MG11 to MGNM are complementary to each other. For example, the data written into the first memory unit MA11 and the data written into the second memory unit MB11 are complementary to each other. That is, when the data written into the first memory unit MA11 is 0, the data written into the second memory unit MB11 is 1. On the contrary, when the data written into the first memory unit MA11 is 1, the data write in to the second memory unit MB11 is 0.

It should be noted that, the comparison unit 137 determines the memory data according to the received current, voltage, or the resistance value.

Figure 4:
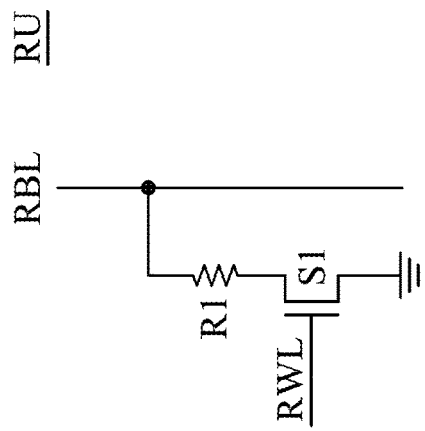
FIG. 4 is a reference unit in accordance with some embodiments of the present disclosure.

Reference is made to FIG. 4. FIG. 4 is a reference unit RU in accordance with some embodiments of the present disclosure. The reference unit RU as illustrated in FIG. 4 may represents the reference units RU1 to RUM as illustrated in FIG. 2.

The reference unit RU includes the resistor R1 and the switch S1. The resistor R1 may be the resistor formed by the set operation or the reset operation of the memory layer in the reference units RU1 to RUM. The control terminal of the switch S1 is coupled to the reference word line RWL as illustrated in FIG. 2. The first terminal of the switch S1 is connected to ground, the second terminal of the switch S1 is coupled to the first terminal of the resistor R1, and the second terminal of the resistor R1 is coupled to the reference bit line RBL. The reference bit line RBL may represent the reference bit line RBL1 as illustrated in FIG. 4.

Figure 5:
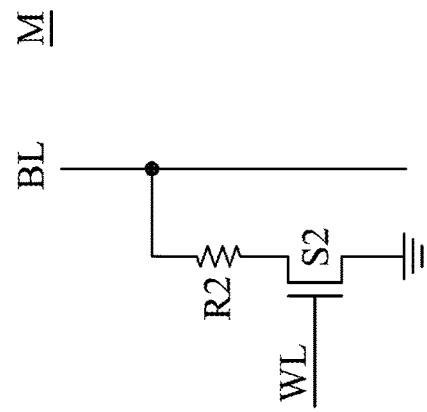
FIG. 5 is a memory unit in accordance with some embodiments of the present disclosure.

Reference is made to FIG. 5. FIG. 5 is a memory unit in accordance with some embodiments of the present disclosure. The memory unit M as illustrated in FIG. 5 may represent the memory units MA11 to MANM or the MB11 to MBNM as illustrated in FIG. 2.

The memory unit M includes a resistor R2 and a switch S2. The resistor R2 may represent the resistor formed after the set operation or the reset operation of the memory layer in the memory units MA11 to MANM or MB11 to MBNM. The control terminal of the switch S2 is coupled to the word line WL. The first terminal of the switch S2 is connected to ground, the second terminal of the switch S2 is coupled to the first terminal of the resistor R2, and the second terminal of the resistor R2 is coupled to the bit line BL. The word line WL may represent the word lines WL1 to WLN in FIG. 2. The bit line BL may represent the bit lines BLA1 to BLAM, BLB1 to BLBM in FIG. 2.

Based on the aforementioned embodiments, the present disclosure provides a memory device, and in particular, a phase change memory device. By reading the data of the dual memory unit to determine whether the data stored in the memory unit is "1" or "0", the accuracy of determining the data of the memory unit is increased. Furthermore, in the embodiments of the present disclosure, the memory may be adjusted to the single memory operation mode as needed to increase the capacity of the memory device. Namely, the user may adopt single memory unit mode or dual memory unit mode according to his own needs.

Although the present disclosure has been described in considerable detail with reference to certain embodiments thereof, other embodiments are possible. Therefore, the spirit and scope of the appended claims should not be limited to the description of the embodiments contained herein.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A memory device, comprising:
   a memory array, comprising
      a plurality of bit lines, a plurality of word lines, a reference word line, a reference bit line, a plurality of memory units coupling with the bit lines and the word lines and a plurality of reference units coupling with the reference word line and the reference bit line;
   a bit line driving circuit, configured to interpret a memory bit address and to drive one of the bit lines;
   a word line driving circuit, configured to interpret a memory word address and to drive one of the word lines;
   a read/write circuit, configured to read, write, or reset the memory units;
   a controller, configured to switch the memory array to work in a single memory unit mode or a dual memory unit mode;
   a reference driving circuit, configured to drive the reference word line to drive one of the reference units.

2. The memory device of claim 1, wherein the single memory unit mode is reading a value of one of the memory units and reading a value of one of the reference units, so as to determine a data; the dual memory unit mode is reading the values of two of the memory units, so as to determine a data.

3. The memory device of claim 2, wherein the reference word line is located at a top, a bottom, or a middle of the memory array.

4. The memory device of claim 3, wherein each of the memory units comprises a memory element, each of the reference units comprises a reference element, and a material and a structure of the reference element is the same as a material and a structure of the memory element.

5. The memory device of claim 4, wherein the memory element and the reference element are phase change memory elements.

6. The memory device of claim 1, wherein the bit line driving circuit further comprises:
   a first decoding circuit; and
   a second decoding circuit;
   wherein each of the memory units couples to the first decoding circuit or the second decoding circuit;
   wherein each of the reference units couples to the first decoding circuit and the second decoding circuit through the reference bit line.

7. The memory device of claim 6, wherein when the memory array works in the single memory unit mode, the read/write circuit reads a value of one of the reference units through the first decoding circuit, and reads a value of another one of the memory units through the second decoding circuit.

8. The memory device of claim 6, wherein when the memory array works in the dual memory unit mode, the read/write circuit read a value of one of the memory units through the first decoding circuit, and read a value of another one of the memory units through the second decoding circuit.

9. The memory device of claim 8, wherein the one of the memory units and the another one of the memory units are adjacently placed in the memory array.

10. The memory device of claim 6, wherein the read/write circuit further comprises:
    a sense amplifier circuit, coupled to the first decoding circuit and the second decoding circuit, and configured to determine a data.

11. A memory device, comprising:
    a memory array, comprising:
       a plurality of first bit lines;
       a plurality of second bit lines, wherein the first bit lines and the second bit lines are aligned sequentially;
       a plurality of word lines;
       a reference bit line;
       a reference word line;
       a plurality of reference units coupling with the reference word line and the reference bit line; and a plurality of memory unit groups, each of the memory unit groups coupled to one of the word lines, wherein each of the memory unit groups comprises:
  a first memory unit, coupled to one of the first bit lines; and
  a second memory unit, coupled to one of the second bit lines;
a bit line driving circuit, comprising:
  a first decoding circuit, coupled to the first bit lines;
  a second decoding circuit, coupled to the second bit lines; and
  a read/write circuit, coupled to the first decoding circuit and the second decoding circuit, and configured to read or write the memory units; and
a word line driving circuit, coupled to the word lines.

12. The memory device of claim 11, wherein the first memory unit and the second memory unit are adjacently placed, the read/write circuit determines a memory data according to a first resistance value of the first memory unit and a second resistance value of the second memory unit.

13. The memory device of claim 11, wherein
each of the reference units coupled to the first decoding circuit and the second decoding circuit through the reference bit line;
wherein the read/write circuit reads a first data of one of the reference units through the first decoding circuit, and determines a memory data of the second memory unit according to the first data; the read/write circuit further reads a second data of one of the reference units through the second decoding circuit, and determines a memory data of the first memory unit according to the second data.

14. The memory device of claim 12, wherein the read/write circuit further comprises:
a sense amplifier circuit, coupled to the first decoding circuit and the second decoding circuit, and configured to determine the memory data.

15. The memory device of claim 13, wherein the read/write circuit further comprises:
a sense amplifier circuit, coupled to the first decoding circuit and the second decoding circuit, and configured to determine the memory data.

* * * * *